310-335 SR
XR 3,973,152

United States Patent [19] [11] 3,973,152
Karplus [45] Aug. 3, 1976

[54] ULTRASONIC TRANSDUCER WITH LAMINATED COUPLING WEDGE

[75] Inventor: Henry H. B. Karplus, Hinsdale, Ill.

[73] Assignee: The United States of America as represented by the United States Energy Research and Development Administration, Washington, D.C.

[22] Filed: Apr. 3, 1975

[21] Appl. No.: 565,020

[52] U.S. Cl. .................................. 310/8.3; 310/8.7; 310/9.1; 73/67.5 R; 73/71.5 US

[51] Int. Cl.² .................................. H01L 41/08

[58] Field of Search ............... 310/8.2, 8.3, 8.7, 9.1, 310/9.4; 340/8 MM; 73/67.5 R, 71.5 U, 67.6, 67.7, 67.8, 67.9; 333/30 R; 181/.5

[56] References Cited

UNITED STATES PATENTS 2,881,336 4/1959 Elion .................................. 310/8.2
3,352,376 11/1967 Dory .................................. 73/71.5 U
3,379,902 4/1968 Harris et al. .......................... 310/8.3 X

*Primary Examiner*—Mark O. Budd
*Attorney, Agent, or Firm*—Dean E. Carlson; Arthur A. Churm; Frank H. Jackson

[57] ABSTRACT

An ultrasonic transducer capable of use in a high-temperature environment incorporates a laminated metal coupling wedge including a reflecting edge shaped as a double sloping roof and a transducer crystal backed by a laminated metal sound absorber disposed so as to direct sound waves through the coupling wedge and into a work piece, reflections from the interface between the coupling wedge and the work piece passing to the reflecting edge. Preferably the angle of inclination of the two halves of the reflecting edge are different.

9 Claims, 6 Drawing Figures

ULTRASONIC TRANSDUCER WITH LAMINATED COUPLING WEDGE

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

This invention relates to an acoustic transducer. In more detail, the invention relates to an ultrasonic transducer which is useful for high-temperature applications. In still more detail, the invention relates to a coupling wedge for use in a high-temperature transducer.

Ultrasonic transducers contain a slab of piezoelectric material which is mechanically strained on application of an external electric field and which generates an electric charge upon application of a mechanical stress. Reflections of the ultrasonic waves within the transducer produce disturbances as some are reflected often enough to produce spurious signals in the transducer and yet not often enough to be internally absorbed. Accordingly, transducers built for room temperature operation normally contain some plastic or rubber-like material to damp out the natural vibrations of the transducer components. However, materials with high internal loss exhibit such losses only in a narrow temperature range. At high temperatures such materials cannot be employed. Accordingly, standard commercially available ultrasonic transducers cannot be employed in a high-temperature environment such as that of a liquid-metal-cooled nuclear reactor wherein temperatures of 1000°F. or more are met. One important utility for such a transducer would be in a flow meter in a liquid-metal-cooled fast breeder nuclear reactor. The transducer could also be used in an under sodium scanning system, liquid level indicators or in standard non-destructive testing equipment.

SUMMARY OF THE INVENTION

According to the present invention, an ultrasonic transducer capable of use in a high-temperature environment — 1000°F. or more — incorporates a laminated metal coupling wedge including a reflecting side edge shaped as a double sloping roof and a laminated metal sound absorber backing for the ultrasonic transducer crystal. Specifically, the ultrasonic transducer includes a coupling wedge formed of a plurality of thin metal plates, held together under pressure and constructed with one edge optically smooth to which is attached the transducer crystal, a second edge shaped to conform to the body into which ultrasonic waves are to be directed and a third reflecting edge shaped as a doubly sloping roof, the angle of inclination of the two surfaces of the roof preferably being slightly different, and the angle of the first and third edges to the second edge being the same. In addition, the transducer includes laminated metal backing for the transducer crystal for damping back waves from the crystal.

BRIEF DESCRIPTION OF THE DRAWINGS

The invention will next be described in connection with the accompanying drawings wherein.

SPECIFIC EMBODIMENT OF THE INVENTION

Figure 1:
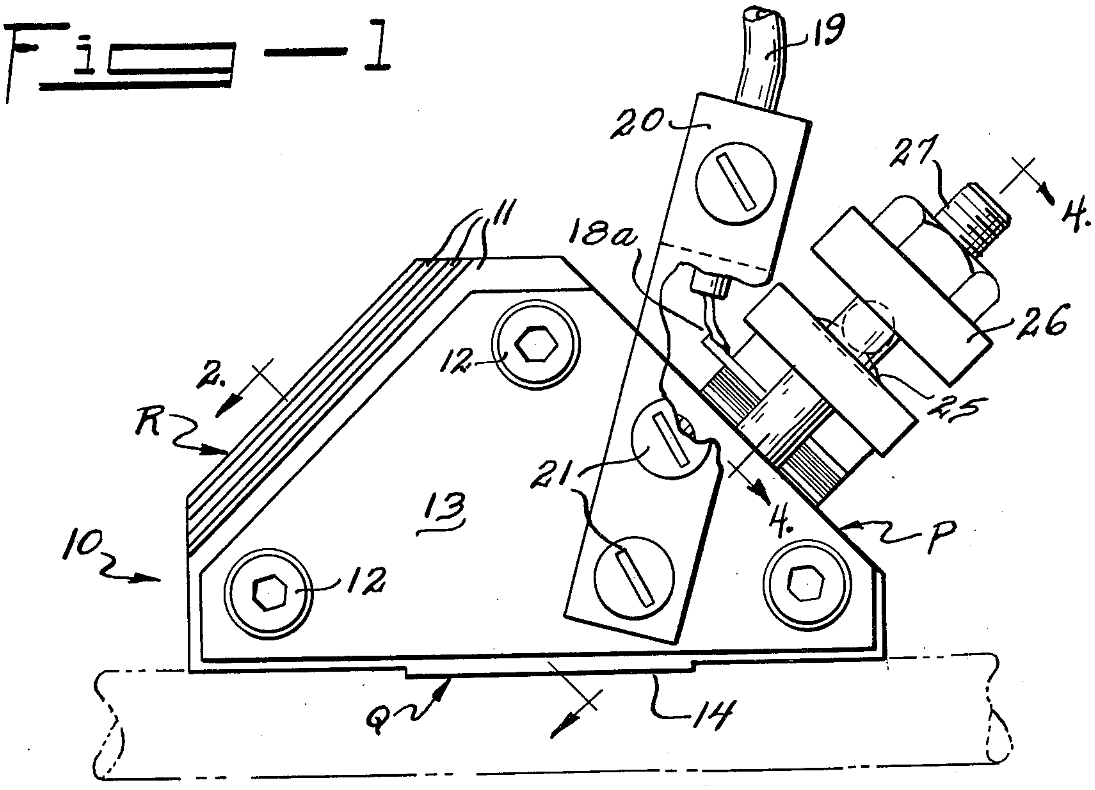
FIG. 1 is a side elevation of an ultrasonic transducer according to the present invention.

As shown in the drawings, the ultrasonic transducer according to the present invention includes a coupling wedge 10 formed of a plurality of thin stainless steel — or other corrosion and temperature-resistant material — plates or laminae 11 held together under a pressure of 500 to 1000 psi (35 to 70 kg/sq. cm.) by bolts 12 through clamp plates 13 on opposite sides of the coupling wedge. According to one embodiment of the invention (shown in FIG. 2), wedge 10 is ½ inch (1.3 cm.) in width and contains 10 laminae, each of which is 0.05 inch (0.13 cm.) in width. According to another embodiment of the invention (shown in FIG. 3), wedge 10 is 0.43 inch (1.1 cm.) in width and contains four 3/32 inch (0.24 cm.) laminae at the center and five 5-mil (0.013 cm.) shims on the sides to eliminate transmissions to the clamping plates. Coupling wedge 10 is generally triangular in shape, having three functional sides — formed by edges of the laminae 11. A first edge P is polished optically flat to within 0.5 micron to receive the transducer crystal. A second edge Q is conveniently at an angle of 45° to the first edge and has a boss 14 thereon shaped to conform to the object into which ultrasonic waves are to be directed. Since the most immediately important utility for the device here described is in a flow meter for measuring liquid metal flow through a pipe, boss 14 is concave to conform to the shape of the pipe (shown in FIG. 1 in phantom). An important element of novelty in the present invention is the shape of the third or reflecting edge R of coupling wedge 10. Edge R is at an angle of 45° to edge Q. The edge of each of the laminae 11 forming wedge 10 is cut at an angle such that side R has the shape of a double sloping roof. While the specific angle of inclination of the two halves of the roof is not critical, they should fall within the range of 50 to 65°, said angle being taken with respect to a plane normal to the plane of the laminae 11. According to a preferred embodiment of the invention, the angle of inclination of the two halves of the roof is different by about 5°. According to one specific embodiment of the invention, the angle of inclination of one-half of the roof is 55° and of the other 60°. When the angle of inclination of the two halves of the roof is different, reflections from both halves will not reinforce one another when waves are reflected back to the crystal.

Sound waves originate in crystal 15 — which may be, for example, a 0.010-inch-thick (0.025 cm.) lithium niobate ($LiNbO_3$) wafer. Crystal 15 is backed by six 0.003-inch-thick (0.0076 cm.) stainless steel foils 16 which serve to damp sound waves originating at the back side of the crystal. Crystal 15 has 0.001-inch-thick (0.0025 cm.) platinum foils 17 on both sides thereof to segregate the $LiNbO_3$ crystal from the stainless steel laminae 11 and foils 16 to minimize oxygen migration from the $LiNbO_3$ wafer to the stainless steel which might otherwise occur at the temperatures of interest. In addition, platinum is soft and conforms to the shape of the bodies on either side of it. An elongated stainless steel foil 18 which is 0.020 inch thick (0.05 cm.) is disposed at the end of the stack of foils 16 and serves as contact point for an electrical connector 18*a* with the central conductor of a mineral-insulated coaxial cable 19 held in position by block 20 fastened to clamp plates 13 by bolts 21.

The transducer crystal 15 and the foils surrounding it, together with an insulating member 22, is clamped against surface P of coupling wedge 10 by a ball 23 and saddle 24 arrangement including, if desired, a Belleville Spring 25 to ensure that the clamping force is transmitted evenly to the crystal 15. The clamping force is applied by drawing down clamping plate 26 by bolts 27.

An X-cut $LiNbO_3$ crystal 15 which generates shear waves is preferably employed in the transducer of the present invention, although a crystal generating longitudinal waves could also be employed. When transmitting into a liquid, e.g. liquid sodium, more favorable angles of refraction are obtained by using shear waves than by using longitudinal waves because the shear wave velocity in solids is lower than the longitudinal velocity and, for the same reason, the energy transmitted into the liquid is better. In addition, shear waves are better absorbed at the interface between laminae than are longitudinal waves. A $LiNbO_3$ crystal is preferred because $LiNbO_3$ has a high electro-mechanical coupling coefficient in the shear mode. Using a $LiNbO_3$ crystal generating ultrasonic waves in the shear mode, the angle of incidence of the ultrasonic waves on a pipe — or other work piece — can be chosen such that no mode conversion takes place at the coupling wedge edges, simplifying the design. This result is attained when the angle between edges P and Q of the coupling wedge is greater than 33°. Within these limits pure shear waves are present in the liquid in the pipe.

Figure 2:
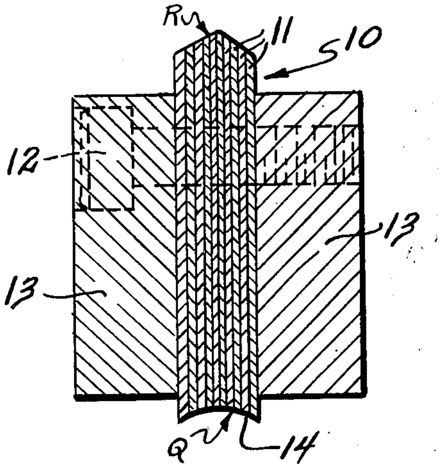
FIG. 2 is a partial sectional view taken in the direction of the arrows 2—2 in FIG. 1.
Figure 4:
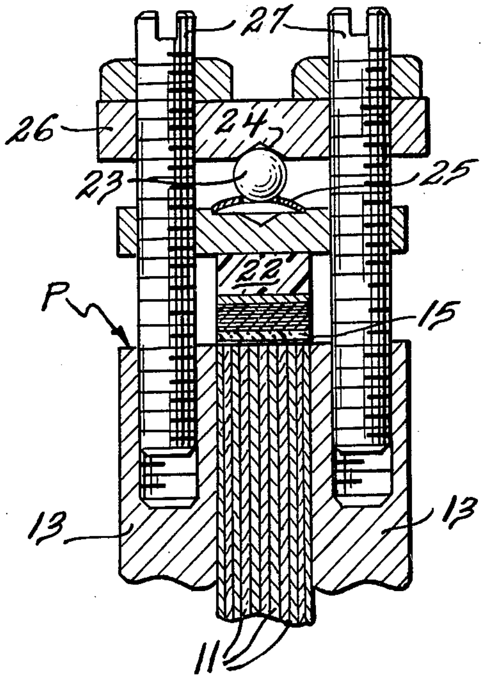
FIG. 4 is a sectional view taken in the direction of the arrows 4—4 in FIG. 1.
Figure 3:
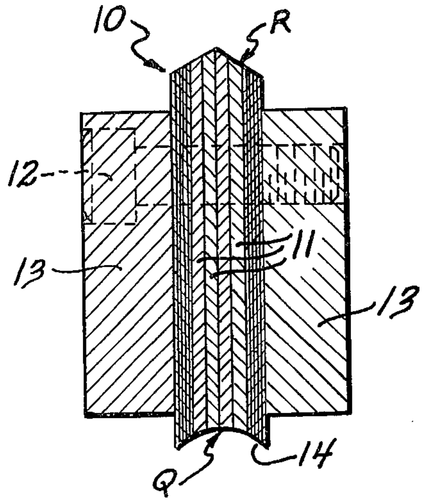
FIG. 3 is a similar view of an alternate embodiment.
Figure 6:
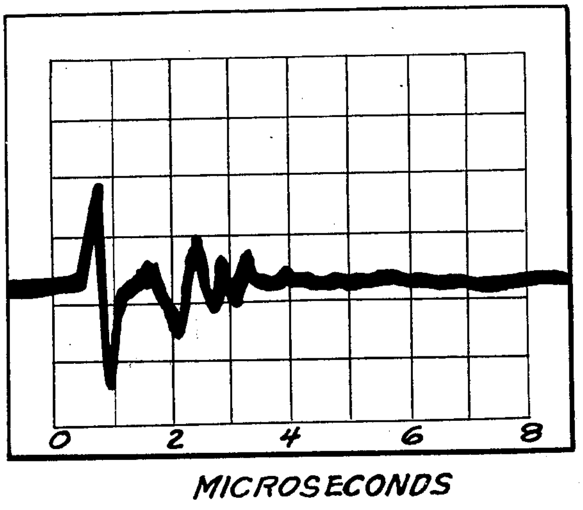
FIG. 6 is an enlarged oscilloscope trace illustrating results which can be attained with a transducer according to the present invention.
Figure 5:
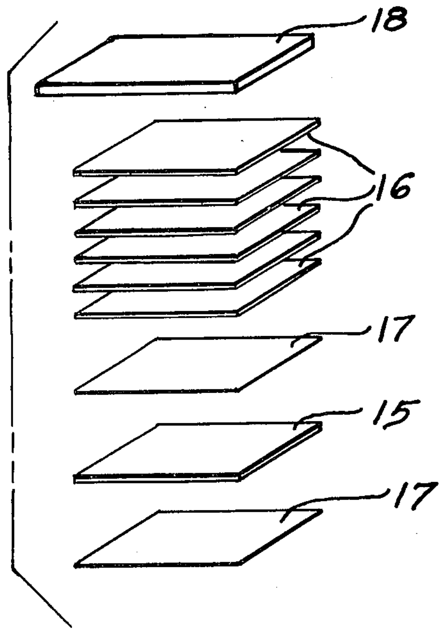
FIG. 5 is an exploded view showing the relationship of the transducer crystal to the parts surrounding it.

A transducer according to the present invention including a coupling wedge as shown in FIG. 2 was tested and the oscilloscope trace of FIG. 6 shows the good results attained in this test. In the test ultrasonic waves were directed into an empty pipe and a 20-foot cable having about a 10-microsecond delay was employed in the circuit to simulate the presence of liquid metal in the pipe. FIG. 6 shows the strong peak of the ultrasonic pulse and the relatively low peaks and rapid damping of the noise associated therewith.

The embodiments of the invention in which an exclusive property or privilege is claimed are defined as follows:

1. An ultrasonic transducer including a coupling wedge consisting of a plurality of thin generally triangular laminae of a corrosion and temperature-resistant material, means for holding the laminae together under pressure, means for directing ultrasonic waves into said coupling wedge through one of the edges of said coupling wedge and into a work piece located at a second edge, the third edge being constructed and arranged to direct ultrasonic waves reflected from the interface between the coupling wedge and the work piece across interfaces between the laminae.

2. An ultrasonic transducer according to claim 1 wherein said third edge is shaped as a double sloping roof.

3. An ultrasonic transducer according to claim 2 wherein the angles of inclination of the two halves of the third edge are different.

4. An ultrasonic transducer according to claim 3 wherein the angle of inclination of one half of the third edge with respect to a plane normal to the plane of the laminations is 55° and the angle of inclination of the other is 60°.

5. An ultrasonic transducer according to claim 1 wherein the coupling wedge is formed of 10 metal sheets each 0.05 inch in thickness.

6. An ultrasonic transducer according to claim 1 wherein the coupling wedge is formed of four 3/32-inch stainless steel sheets and five 5-mil stainless steel shims on each side thereof.

7. An ultrasonic transducer according to claim 1 wherein the first edge of the coupling wedge is optically smooth and said means for directing ultrasonic waves into said coupling wedge includes a transducer crystal formed of a piezoelectric material, a stack of metal foils backing said crystal as sound-wave-damping material and means for holding said transducer crystal against said optically smooth edge under pressure.

8. An ultrasonic transducer according to claim 7 wherein said transducer crystal is a wafer of $LiNbO_3$ 0.010 inch thick, said backing foils are six in number, formed of stainless steel and are 0.003 inch thick and wherein a 0.001-inch-thick platinum wafer is disposed on both sides of the crystal to minimize oxygen migration.

9. A coupling wedge for an ultrasonic transducer comprising a generally triangular laminated metal block, means for holding the laminations thereof together under pressure, one of the edges of said block being polished optically smooth to receive a transducer crystal in effective contact therewith, a second edge being at an angle of 45° to the first edge and being shaped to conform to the shape of a work piece into which ultrasonic waves are to be directed, and the third edge being at an angle of 45° to the second edge and being shaped like a double sloping roof, whereby ultrasonic waves reflected from the interface between the work piece and the coupling wedge are reflected by the roof shape of the third edge of the coupling wedge across interfaces between laminae of the laminated metal block and are thereby attenuated.

* * * * *